(12) United States Patent
Nakajima

(10) Patent No.: US 7,259,439 B2
(45) Date of Patent: Aug. 21, 2007

(54) SEMICONDUCTOR PHOTODETECTOR AND ITS PRODUCTION METHOD

(75) Inventor: Kazutoshi Nakajima, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 75 days.

(21) Appl. No.: 10/500,238

(22) PCT Filed: Dec. 26, 2002

(86) PCT No.: PCT/JP02/13717

§ 371 (c)(1),
(2), (4) Date: Apr. 20, 2005

(87) PCT Pub. No.: WO03/056634

PCT Pub. Date: Jul. 10, 2003

(65) Prior Publication Data

US 2005/0173712 A1    Aug. 11, 2005

(30) Foreign Application Priority Data

Dec. 27, 2001 (JP) .............................. 2001-397959

(51) Int. Cl.
*H01L 31/00* (2006.01)
(52) U.S. Cl. ...................... 257/466; 257/184; 257/459; 257/E33.076
(58) Field of Classification Search ............... 257/59, 257/184, 446, 459, 466, E33.076
See application file for complete search history.

(56) References Cited

U.S. PATENT DOCUMENTS

| | | | |
|---|---|---|---|
| 3,737,701 A | 6/1973 | Hoeberechts et al. | |
| 4,570,174 A | 2/1986 | Huang et al. | |
| 4,719,498 A | 1/1988 | Wada et al. | |
| 4,941,024 A | 7/1990 | Hayakawa et al. | |
| 5,021,857 A | 6/1991 | Suehiro | |
| 5,023,686 A | 6/1991 | Helmut et al. | |
| 5,101,246 A | 3/1992 | Onodera | |
| 5,333,141 A | 7/1994 | Wolf et al. | |
| 5,471,076 A | 11/1995 | Murakami et al. | |
| 5,569,933 A | 10/1996 | Chu et al. | |
| 6,020,620 A | 2/2000 | Kusakabe | |
| 6,229,165 B1 | 5/2001 | Sakai et al. | |
| 6,232,141 B1 | 5/2001 | Kusakabe | |
| 6,255,710 B1 | 7/2001 | Weitzel et al. | |

(Continued)

FOREIGN PATENT DOCUMENTS

EP    0162677    11/1985

(Continued)

*Primary Examiner*—Howard Weiss
*Assistant Examiner*—John Ingham
(74) *Attorney, Agent, or Firm*—Drinker Biddle & Reath LLP

(57) ABSTRACT

In a semiconductor photodetector 1 according to the present invention, flat surfaces of three steps with different heights are formed in a top surface portion of a semi-insulating GaAs substrate 2. An n-type GaAs layer 3, an i-type GaAs layer 4, and a p-type GaAs layer 5 are successively deposited on the lower step surface formed in a central region of the semi-insulating GaAs substrate 2. Furthermore, a p-side ohmic electrode 6 is provided astride and above a flat surface formed by the p-type GaAs layer 5 and the upper step surface of the semi-insulating GaAs substrate 2, and an n-side ohmic electrode 7 is provided astride and above a flat surface formed by the n-type GaAs layer 3 and the middle step surface of the semi-insulating GaAs substrate 2.

4 Claims, 10 Drawing Sheets

U.S. PATENT DOCUMENTS

| | | |
|---|---|---|
| 6,359,919 B1 | 3/2002 | Ishikawa et al. |
| 6,445,020 B2 | 9/2002 | Fujimura |
| 6,686,616 B1 | 2/2004 | Allen et al. |
| 6,690,079 B2 | 2/2004 | Fujimura et al. |
| 6,791,124 B2 | 9/2004 | Hiraoka et al. |
| 2003/0010993 A1 | 1/2003 | Nakamura et al. |
| 2003/0085412 A1 | 5/2003 | Nakamura et al. |
| 2003/0107108 A1 | 6/2003 | Takagi |
| 2003/0146441 A1 | 8/2003 | Kawano et al. |
| 2003/0155625 A1 | 8/2003 | Kato et al. |
| 2003/0160292 A1 | 8/2003 | Takagi |
| 2003/0218226 A1 | 11/2003 | Ito et al. |
| 2004/0026713 A1 | 2/2004 | Tanoue et al. |
| 2004/0099888 A1 | 5/2004 | Sriram |
| 2005/0051784 A1 | 3/2005 | Niigaki et al. |
| 2005/0173712 A1 | 8/2005 | Nakajima |

FOREIGN PATENT DOCUMENTS

| | | | |
|---|---|---|---|
| JP | 60163471 A * | 8/1985 | ................. 257/459 |
| JP | 61171176 A * | 8/1986 | .......... 257/E31.054 |
| JP | 62-65851 | 4/1987 | |
| JP | 63-285971 | 11/1988 | |
| JP | 02-105584 | 4/1990 | |
| JP | 02-214160 | 8/1990 | |
| JP | 11-307805 | 11/1999 | |
| JP | 2002-163979 | 6/2002 | |
| JP | 2002-214160 | 7/2002 | |

* cited by examiner

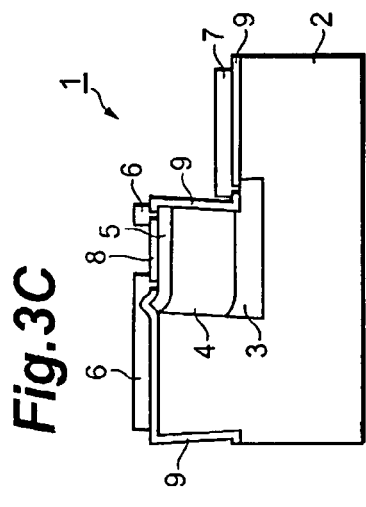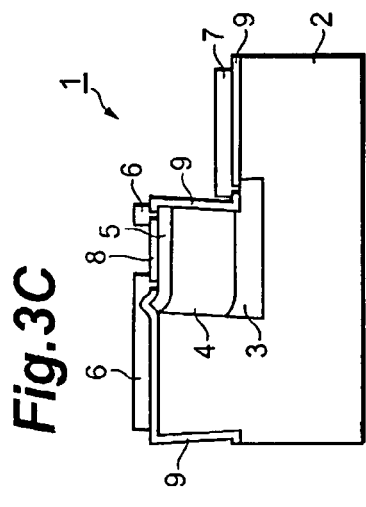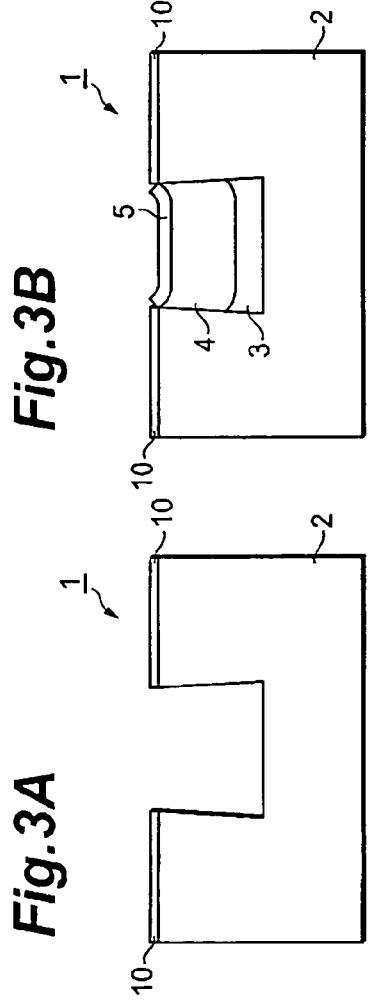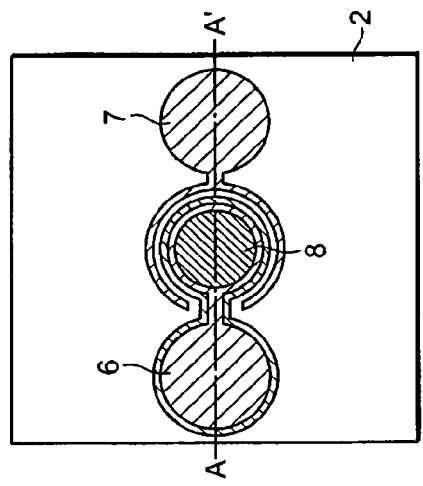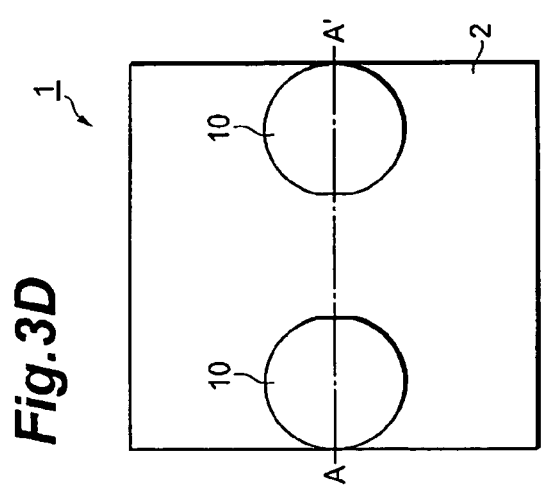

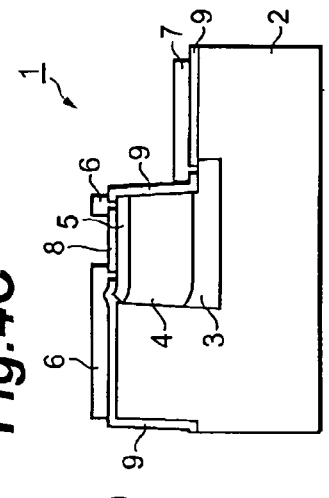 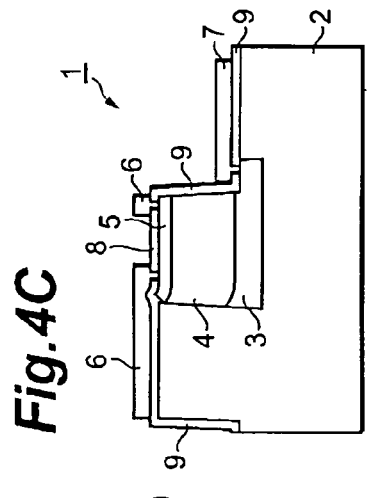 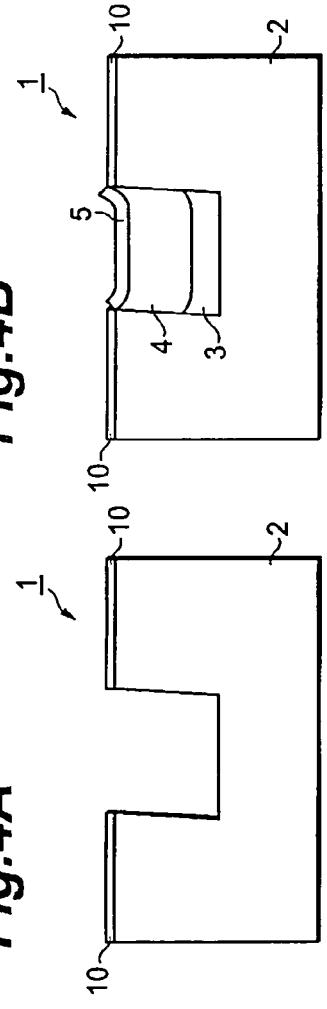
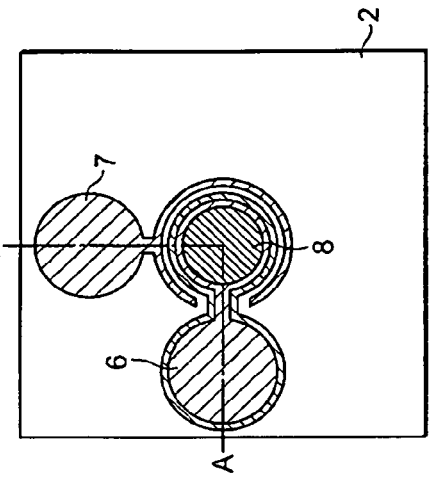 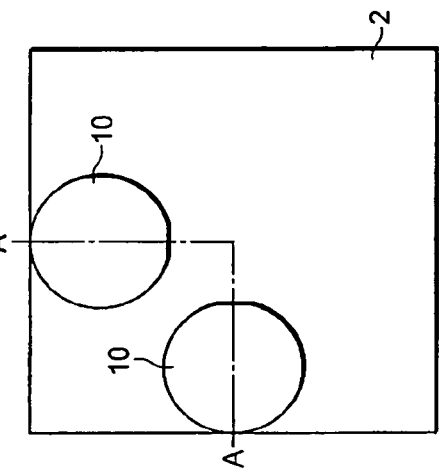

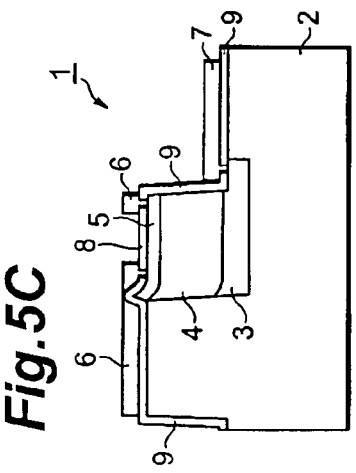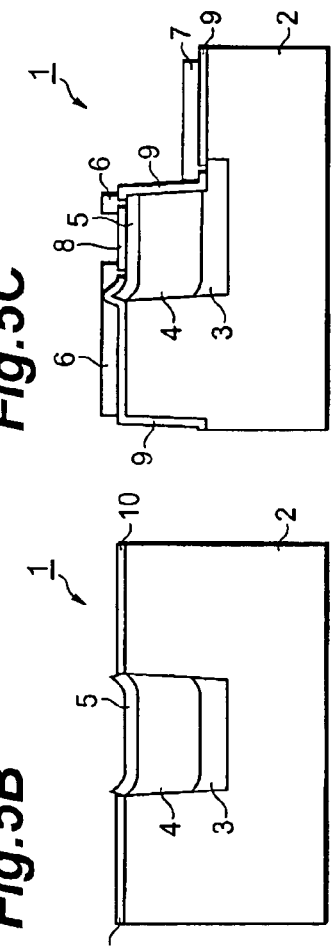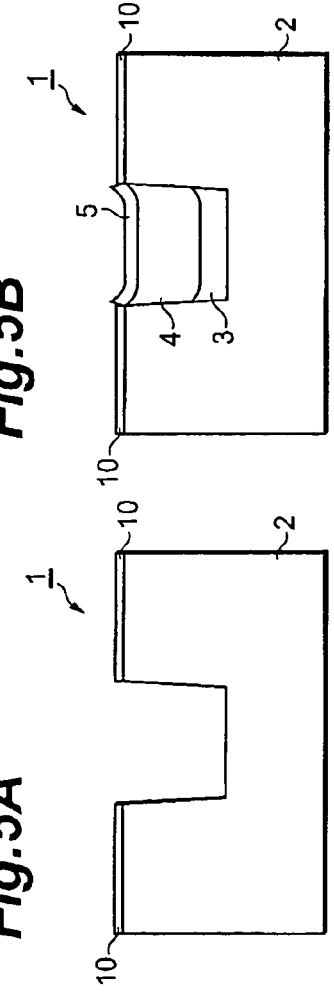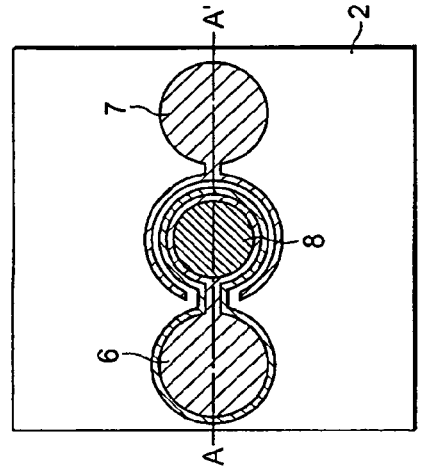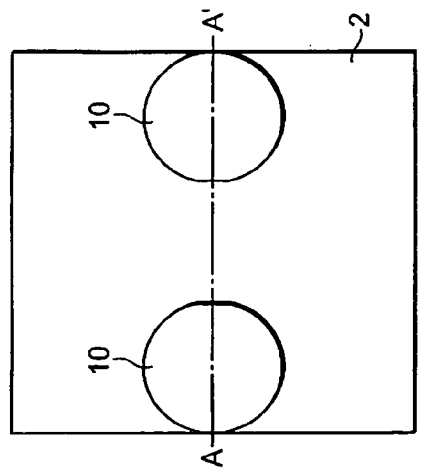

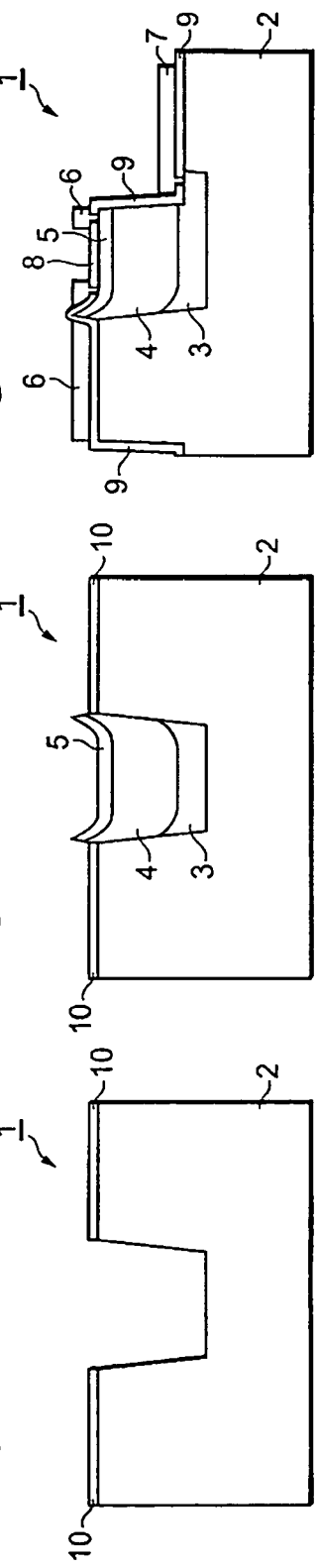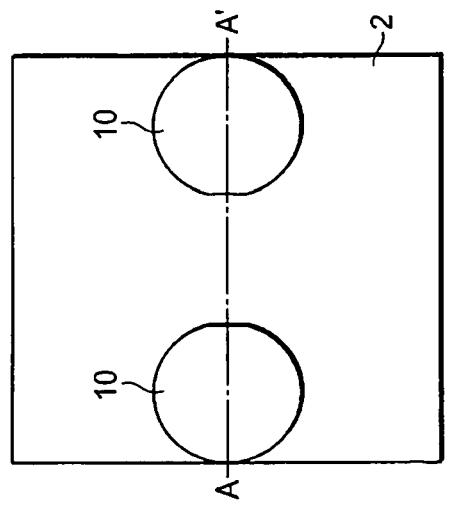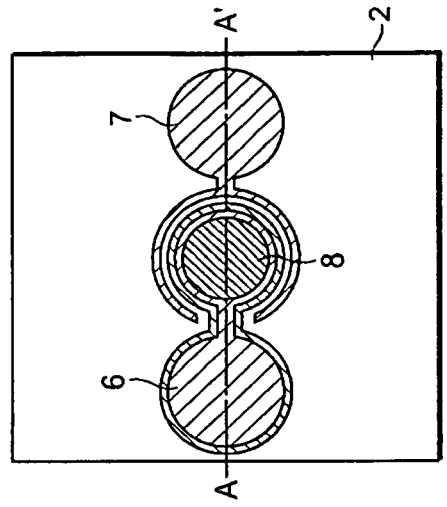

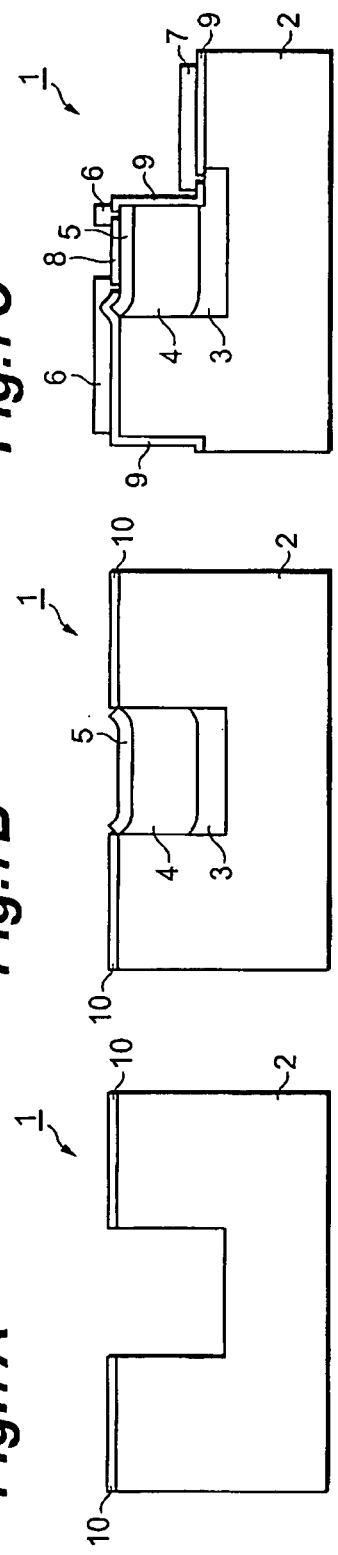

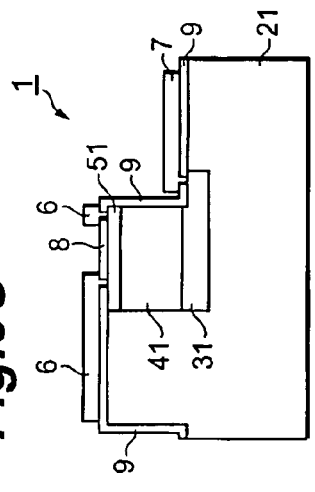
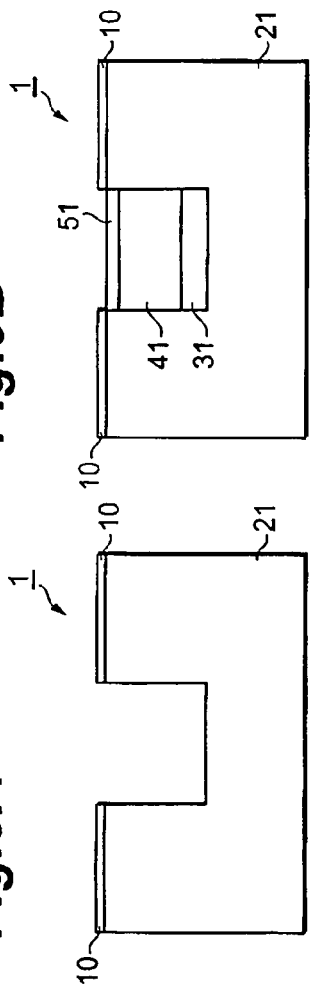
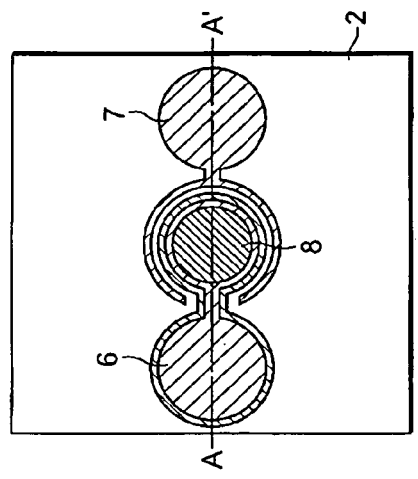
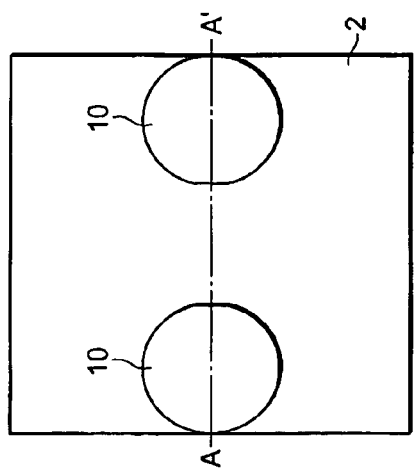

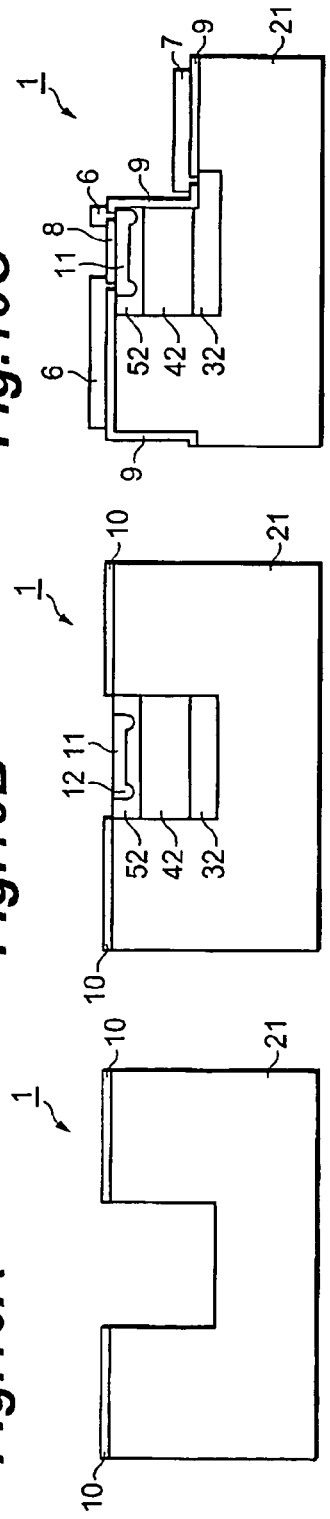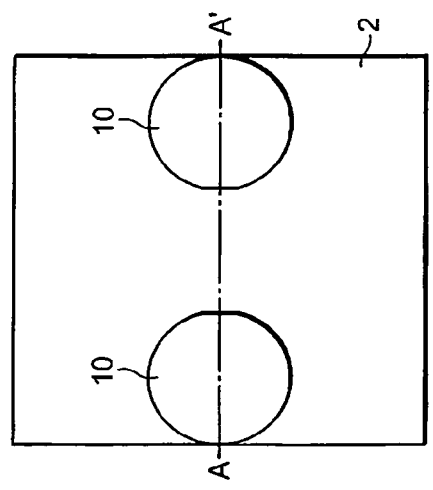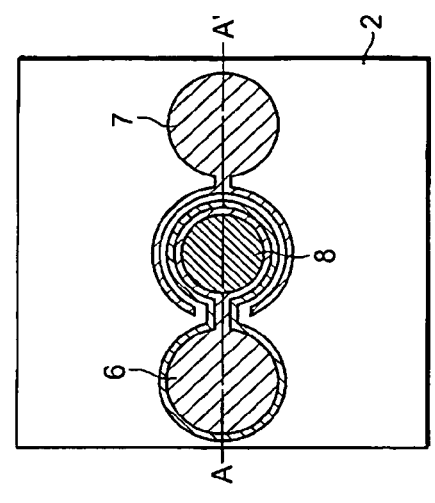

SEMICONDUCTOR PHOTODETECTOR AND ITS PRODUCTION METHOD

TECHNICAL FIELD

The present invention relates to a semiconductor photodetector and a method of production thereof.

BACKGROUND ART

The conventional photoelectric conversion elements such as photodiodes (PDs) and avalanche photodiodes (APDs) are fabricated by forming pn-junction semiconductor layers on a high-density p-type or n-type semiconductor substrate by crystal growth, impurity diffusion, and so on. In recent years, in terms of high photosensitivity and high response, semiconductor photodetectors in which electrodes containing bonding pads for electrical connection with electrodes are provided on a semi-insulating substrate have been developed and are in practical use.

For example, Japanese Patent Application Laid-Open No. 63-285971 (Document 1) discloses a semiconductor photodetector in which two types of semiconductor layers with different characteristics are exposed on an identical plane of a semi-insulating substrate to enable placement of electrodes on a flat surface. The semiconductor photodetector of this type was useful in terms of achievement of low capacitance, but required special techniques of forming depression portions of two steps with a small depth difference in a flat portion of the semi-insulating substrate and etching back the semiconductor layers deposited in the depression portions and a substance with different characteristics, such as a photoresist, at almost equal rates in its production process.

Disclosed as a technique for remedying the problem as described above is a semiconductor photodetector which has two types of semiconductor layers crystal-grown in a mesa shape on a flat surface of a semi-insulating substrate and in which electrodes are laid on exposed portions of the semiconductor layers. The semiconductor photodetector of this type is disclosed, for example, as a conventional example in Japanese Patent Application Laid-Open No. 2-105584 (Document 2).

DISCLOSURE OF THE INVENTION

However, while the technique described in Document 2 does not require the shaping of the semi-insulating substrate of the semiconductor photodetector and the special etching technique, a steep ramp of a level difference equal to a layer thickness is made between the flat portion of the semi-insulating substrate and the semiconductor layers. Providing electrode wiring on such ramp part can cause disconnection or insulation failure due to deterioration of coverage, and also requires a complicated and hard process. As a result, there were such problems as degradation of yield and reproducibility of semiconductor photodetectors fabricated, degradation of reliability as a product, and so on.

The present invention has been accomplished under the above circumstances and an object of the invention is therefore to realize easy fabrication of a semiconductor photodetector with improvement in yield and reproducibility.

In order to achieve the above object, a semiconductor photodetector according to the present invention is a semiconductor photodetector comprising: a semi-insulating substrate having an upper step surface, a middle step surface, and a lower step surface with their respective heights different from each other in a top surface portion, the lower step surface being located between the upper step surface and the middle step surface; a first semiconductor layer formed immediately above the lower step surface, having a first top surface portion of a flat surface shape with a height equal to that of the middle step surface and a second top surface portion with a height equal to or higher than that of the first top surface portion, and comprising a first impurity; a second semiconductor layer formed above the second top surface portion of the first semiconductor layer, having a top surface portion of a flat surface shape with a height equal to that of the upper step surface, and comprising a second impurity; a first electrode provided astride and above the first top surface portion of the first semiconductor layer and the middle step surface of the semi-insulating substrate; and a second electrode provided astride and above the top surface portion of the second semiconductor layer and the upper step surface of the semi-insulating substrate.

The semiconductor photodetector having the above configuration is of the structure in which at least a portion of the top surface portion (surface) of the first semiconductor layer makes a flat surface at the height equal to that of the middle step surface of the semi-insulating substrate and in which the top surface portion (surface) of the second semiconductor layer makes a flat surface at the height equal to that of the upper step surface of the semi-insulating substrate. Therefore, each of the electrodes in contact with the respective semiconductor layers can be placed on a continuous flat surface. As a result, it becomes feasible to provide the semiconductor photodetector less likely to suffer disconnection and insulation failure, as compared with those wherein the electrodes are placed astride the ramp portion.

When further comprising a third semiconductor layer formed between the first semiconductor layer and the second semiconductor layer and having a carrier density lower than that of the first semiconductor layer or the second semiconductor layer, the semiconductor photodetector can be constructed with the third semiconductor layer as a light absorbing layer. In this case, when the third semiconductor layer is set in an optimal thickness for a length of optical absorption determined by a wavelength of incident light, the semiconductor photodetector can be constructed with high optical absorption efficiency.

A ramp portion consisting of a level difference between the upper step surface and the lower step surface of the semi-insulating substrate is inclined in a radial direction of a depression formed by the upper step surface and the middle step surface, in a direction from the lower step surface to the upper step surface. Therefore, it is feasible to prevent each semiconductor layer from climbing near the ramp portion, and thereby to make a projection of the second semiconductor layer smaller in the surface portion. As a result, it becomes feasible to lay the second electrode on a flatter surface.

A method of producing a semiconductor photodetector according to the present invention is a method of production of a semiconductor photodetector comprising: a first step of forming a recess with a predetermined depth in a semi-insulating substrate by etching; a second step of forming a stack of a first semiconductor layer comprising a first impurity and a second semiconductor layer comprising a second impurity, selectively only in the recess of the semi-insulating substrate formed in the first step; a third step of further etching a part of the semi-insulating substrate so as to expose at least a portion of the first semiconductor layer formed in the second step; and a fourth step of laying a first electrode in contact with the exposed portion of the first semiconductor layer exposed in the third step and laying a second electrode in contact with the second semiconductor layer above the semi-insulating substrate.

According to the above production method, level differences are made in the semi-insulating substrate itself, whereby the semiconductor photodetector with the electrodes on the flat surfaces of the semi-insulating substrate less likely to suffer disconnection can be readily fabricated without use of the special etching technique. As a result, it is feasible to provide the semiconductor photodetector excellent in yield and reproducibility.

In view of ease of selective growth, preferably, the second step is to form the stack of the first semiconductor layer and the second semiconductor layer by vapor deposition.

Furthermore, in order to minimize the projection of the semiconductor layer in the surface portion, preferably, the first step is to form the recess of the semi-insulating substrate so that at least a side wall portion on the second electrode side among side wall portions in a sectional shape along a direction connecting the first electrode to the second electrode is of an inverted mesa shape (a shape of the recess the side wall portion of which is inclined in the radial direction of the bottom surface of the recess). Since each semiconductor layer is formed according to the shape of the recess, when the recess is formed in this sectional shape, it is feasible to decrease the climbing of the semiconductor layers near the ramp portion in their deposition steps and to prevent a projection in the surface portion. As a result, electrode wiring can be provided on a flatter surface, which can improve the yield and reproducibility of the semiconductor photodetector more.

As long as at least the side wall portion on the second electrode side is formed in the inverted mesa shape in the sectional shape of the recess, even if the side wall portion on the first electrode side is formed in the normal mesa shape, the aforementioned effect can also be achieved by further etching the semi-insulating substrate in that part.

BRIEF DESCRIPTION OF THE DRAWINGS

FIG. 3A is a view showing a recess forming step of a semiconductor photodetector as a second embodiment, FIG. 3B a view showing a deposition step, FIG. 3C a view showing an exposing step, FIG. 3D a plan view corresponding to FIG. 3A, and FIG. 3E a plan view corresponding to FIG. 3C.

FIG. 4A is a view showing a recess forming step of a semiconductor photodetector as a third embodiment, FIG. 4B a view showing a deposition step, FIG. 4C a view showing an exposing step, FIG. 4D a plan view corresponding to FIG. 4A, and FIG. 4E a plan view corresponding to FIG. 4C.

FIG. 5A is a view showing a recess forming step of a semiconductor photodetector as a fourth embodiment, FIG. 5B a view showing a deposition step, FIG. 5C a view showing an exposing step, FIG. 5D a plan view corresponding to FIG. 5A, and FIG. 5E a plan view corresponding to FIG. 5C.

FIG. 6A is a view showing a recess forming step of a semiconductor photodetector as a fifth embodiment, FIG. 6B a view showing a deposition step, FIG. 6C a view showing an exposing step, FIG. 6D a plan view corresponding to FIG. 6A, and FIG. 6E a plan view corresponding to FIG. 6C.

FIG. 7A is a view showing a recess forming step of a semiconductor photodetector as a sixth embodiment, FIG. 7B a view showing a deposition step, FIG. 7C a view showing an exposing step, FIG. 7D a plan view corresponding to FIG. 7A, and FIG. 7E a plan view corresponding to FIG. 7C.

FIG. 9A is a view showing a recess forming step of a semiconductor photodetector as an eighth embodiment, FIG. 9B a view showing a deposition step, FIG. 9C a view showing an exposing step, FIG. 9D a plan view corresponding to FIG. 9A, and FIG. 9E a plan view corresponding to FIG. 9C.

FIG. 10A is a view showing a recess forming step of a semiconductor photodetector as a ninth embodiment, FIG. 10B a view showing a deposition step, FIG. 10C a view showing an exposing step, FIG. 10D a plan view corresponding to FIG. 10A, and FIG. 10E a plan view corresponding to FIG. 10C.

BEST MODE FOR CARRYING OUT THE INVENTION

Figure 1A:
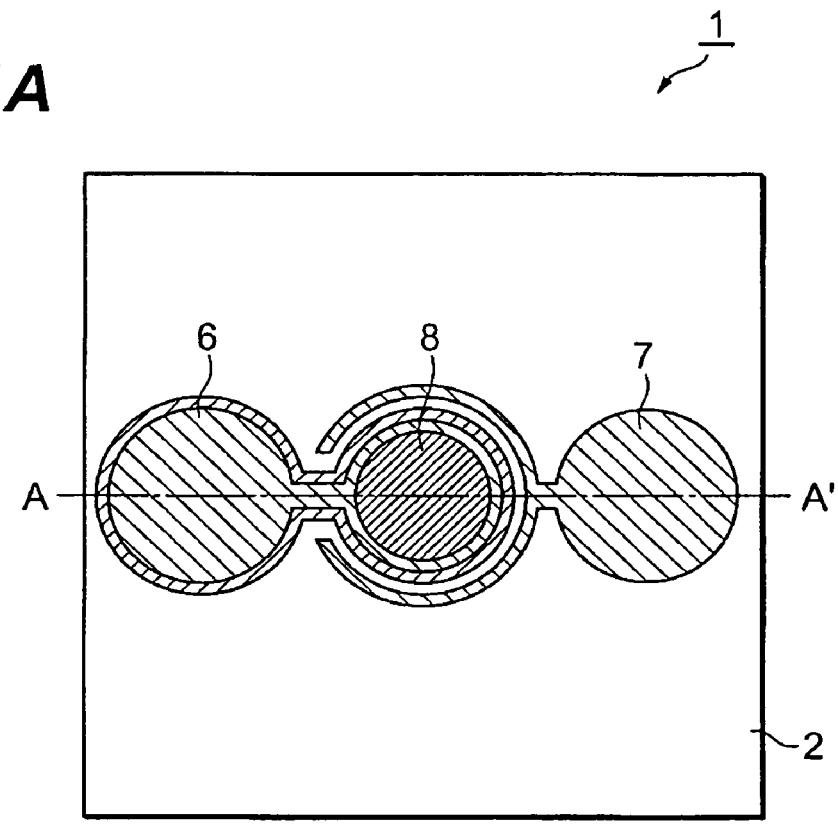
FIG. 1A is a plan view of a semiconductor photodetector as a first embodiment and FIG. 1B a sectional view of the semiconductor photodetector along AA'.

Preferred embodiments of the semiconductor photodetector and the production method of the semiconductor photodetector according to the present invention will be described below in detail with reference to the accompanying drawings. In the description below identical or equivalent elements will be denoted by the same reference symbols, without redundant description. It is also noted that ratios in the drawings do not always agree with those in the description.

First Embodiment

Figure 1B:
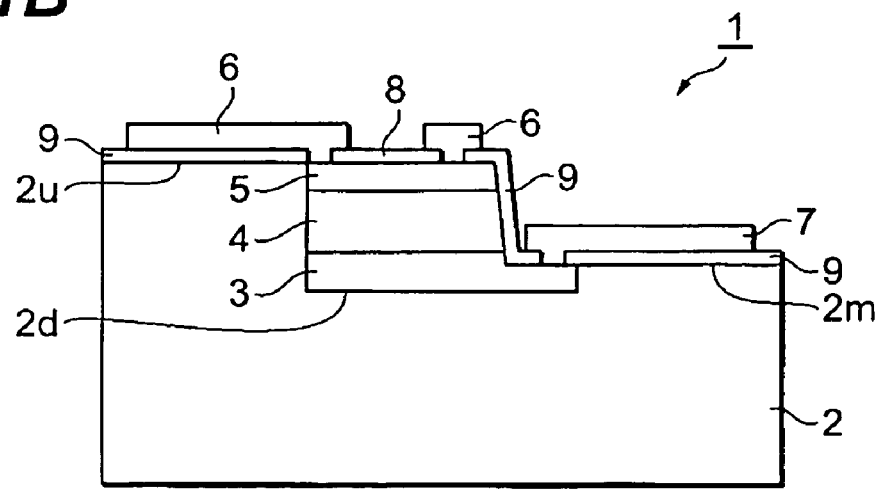

FIG. 1A is a schematic plan view of semiconductor photodetector 1 in the first embodiment and FIG. 1B a schematic sectional view along chain line AA' in FIG. 1A. First, the configuration will be described. As shown in FIG. 1B, a semi-insulating GaAs substrate 2 has three top surface portions with different heights (which will be referred to as "upper step surface," "middle step surface," and "lower step surface" and which will be denoted by $2u$, $2m$, and $2d$, respectively, in FIG. 1B). The heights of the respective step surfaces are set in decreasing order of height: the upper step surface, the middle step surface, and the lower step surface, and a level difference between the upper step surface and the middle step surface is preferably about 1-5 μm (specifically, 2.5 μm). A level difference between the middle step surface and the lower step surface is preferably about 0.1-2 μm (specifically, 0.5 μm). The step surfaces are formed so that the upper step surface and the middle step surface are located on both sides of the lower step surface in the horizontal direction (i.e., so that the lower step surface is interposed between the upper step surface and the middle step surface). This results in forming a depression portion in the depth of about 1 to 7 μm (specifically, 3 μm) from the upper step surface to the lower step surface (the bottom surface of the depression portion) with the bottom surface being the lower step surface and with side walls being a part of the level difference made by the lower step surface and the upper step surface and being the level difference portion made by the lower step surface and the middle step surface, in the central region of the substrate.

This depression portion is filled with an n-type GaAs layer 3 containing a first impurity, which preferably has a layer thickness of about 0.5-2 μm (specifically, 1 μm). Two top surface portions having different heights are present in the top surface of the n-type GaAs layer 3. Namely, a lower-height top surface portion (hereinafter referred to as "first top surface portion") formed on the middle step surface side of the substrate has the height equal to that of the middle step surface and continues to the middle step surface. This permits after-described n-side ohmic electrode 7 to be placed on the first top surface portion and the middle step surface constituting a continuous flat surface, whereby it becomes feasible to prevent the disconnection and insulation failure due to deterioration of coverage, as compared with the case where the electrode is laid astride the level difference part.

A higher-height top surface portion (hereinafter referred to as "second top surface portion") formed on the upper step surface side of the substrate is, preferably, about 0.2-1 μm (specifically, 0.5 μm) higher than the middle step surface. The second top surface portion has the area wider than the first top surface portion. An i-type GaAs layer 4 preferably having the layer thickness of about 0.5-5 μm (specifically, 2 μm) is laid directly on the second top surface portion of the n-type GaAs layer 3 so as to completely cover the second top surface portion.

Furthermore, a p-type GaAs layer 5 preferably having the layer thickness of about 0.005-0.02 μm (specifically, 0.01 μm) and containing a second impurity is laid directly on the i-type GaAs layer 4 so as to completely cover the top surface of the i-type GaAs layer 4. The GaAs layers are deposited in the order of the n-type GaAs layer 3, i-type GaAs layer 4, and p-type GaAs layer 5 named, and the total thickness thereof is approximately 3 μm which is the level difference between the upper step surface and the lower step surface. Namely, the p-type GaAs layer 5 has the height equal to that of the upper step surface of the semi-insulating GaAs substrate 2 and continues to the upper step surface. By placing after-described p-side ohmic electrode 6 on the surface of the p-type GaAs layer 5 and the upper step surface forming a continuous flat surface, the coverage can be improved, while lowering the risk of disconnection and insulation failure.

The i-type GaAs layer 4 has the carrier density lower than that of the n-type GaAs layer 3 and the layer thickness thereof is preferably 0.5-5 μm, specifically, about 2 μm, defining a thickness of a depletion region which contributes to optical absorption. By setting this layer thickness to an optimal value for a length of optical absorption determined by a wavelength of incident light, it is feasible to realize a semiconductor photodetector with high photosensitivity.

On the other hand, lower-step-surface-side edge portions of the respective GaAs layers form a ramp portion (i.e., a cliff-like side wall part in the drawing) consisting of the level difference between the upper step surface and the middle step surface. The ramp portion is covered by an insulating film 9 for maintaining the withstand voltage property of the device and for preventing a short. The insulating film 9 also covers the upper step surface and the lower step surface of the semi-insulating GaAs substrate 2. Furthermore, an antireflection film 8 is formed so as to cover the central region of the top surface of the p-type GaAs layer 5.

A p-side ohmic electrode 6 is provided astride through the insulating film 9 and antireflection film 8 on the upper step surface of the semi-insulating GaAs substrate 2 and on the p-type GaAs layer 5. The p-side ohmic electrode 6 is formed, as shown in FIG. 1A, in a circular shape on the upper step surface of the semi-insulating GaAs substrate 2 and in an annular shape around the antireflection film 8 on the top surface of the p-type GaAs layer 5. Furthermore, the p-side ohmic electrode 6 is in electric contact with the p-type GaAs layer 5 so as to fill a gap between the insulating film 9 and the antireflection film 8 formed on the top surface of the p-type GaAs layer 5.

An n-side ohmic electrode 7 is provided astride through the insulating film 9 on the middle step surface of the semi-insulating GaAs substrate 2 and on the first top surface portion of the n-type GaAs layer 3. The n-side ohmic electrode 7 is formed, as shown in FIG. 1A, in a circular shape having the radius nearly equal to that of the p-side ohmic electrode 6, at a position opposite to the p-side ohmic electrode 6 with the stack region of the semiconductor layers in between (i.e., on the middle step surface of the semi-insulating GaAs substrate 2). On the other hand, the n-side ohmic electrode 7 is formed so as to surround the p-side ohmic electrode 6 with a constant clearance thereto on the top surface of the n-type GaAs layer 3. Furthermore, the n-side ohmic electrode 7 is in electric contact with the n-type GaAs layer 3 so as to fill a gap of the insulating film 9 formed on the top surface of the n-type GaAs layer 3. Except for the contact part, the n-side ohmic electrode 7 is out of contact with the n-type GaAs layer 3.

Each of the p-side and n-side ohmic electrodes is coupled through a conductor (not shown) to a drive power supply (not shown). The cliff-like side wall part in the drawing formed of the GaAs layers is covered by the insulating film 9 only, and the both ohmic electrodes are placed without lying over the side wall part.

Figure 2A:
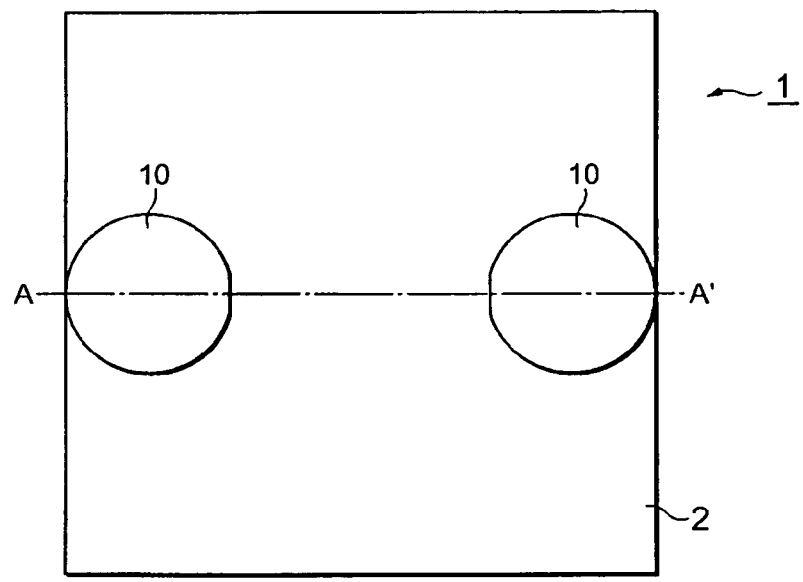
FIG. 2A is a plan view of a semiconductor photodetector in a recess forming step of the semiconductor photodetector of the first embodiment.
Figure 2B:
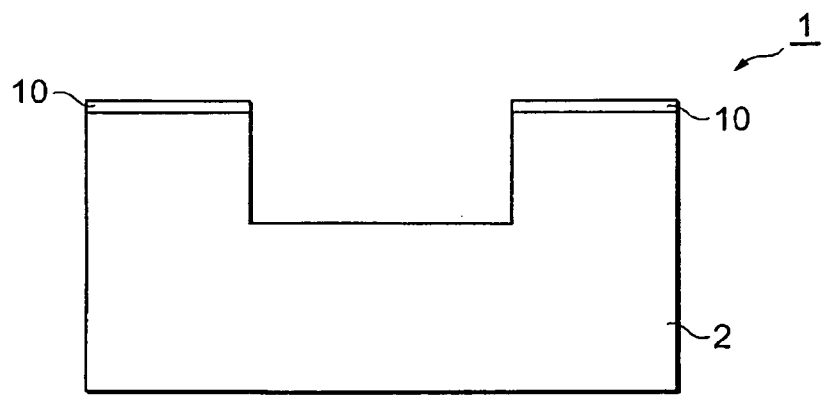
FIG. 2B and FIG. 2C are views each showing a deposition step.
Figure 2C:
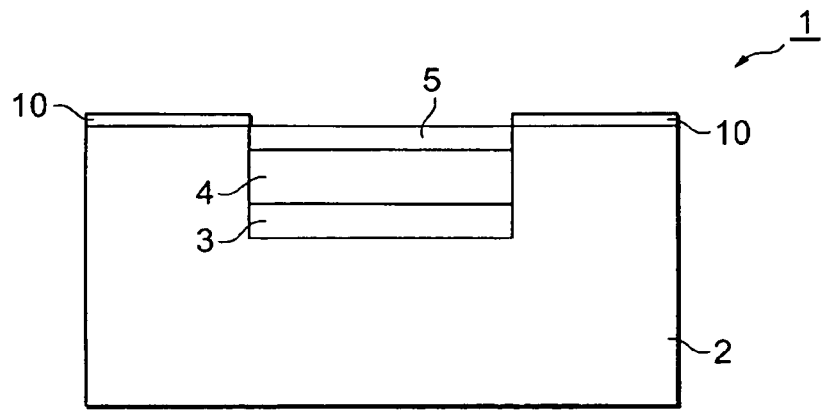

Next, a production method of semiconductor photodetector 1 will be described. FIGS. 2A, 2B, and 2C are schematic sectional views showing production steps of semiconductor photodetector 1 in the first embodiment of the present invention. The first step is ① a step of depositing a silicon oxide film as a protective film 10 for selective growth on a semi-insulating GaAs substrate 2 by a crystal growth method such as plasma CVD (Chemical Vapor Deposition). Then the selective-growth protective film 10 is selectively etched by photolithography to expose a part of the top surface of the semi-insulating GaAs substrate 2. Then the semiconductor photodetector 1 is immersed in a compound liquid prepared in a predetermined composition to chemically etch only the exposed part of the top surface of the semi-insulating GaAs substrate 2. As a consequence, the semiconductor photodetector 1 comes to have the shape as shown in the plan view of FIG. 2A and in the cross section of FIG. 2B.

The next step is ② a step of successively depositing n-type GaAs layer 3, i-type GaAs layer 4, and p-type GaAs layer 5 on the semi-insulating GaAs substrate 2 by a crystal growth method such as low pressure MOCVD (Metal Organic Chemical Vapor Deposition). In this step, the selective-growth protective film 10 prevents crystal growth on the surface thereof and the GaAs layers continuously grow only on the semi-insulating GaAs substrate 2. As a consequence, the semiconductor photodetector 1 is brought into a state in which the p-type, i-type, and n-type GaAs layers 5, 4, 3 are layered in the recess of the semi-insulating GaAs substrate 2, as shown in the schematic sectional view of FIG. 2C. On this occasion, the depth of etching the semi-insulating GaAs substrate 2 is set to be equal to the total thickness of the GaAs layers grown by crystal growth, thereby obtaining a flat shape on the top surface.

The subsequent step is ③ a step of removing the selective-growth protective film 10 and thereafter selectively etching a part of the semi-insulating GaAs substrate 2 by photolithography until a part of the top surface of the n-type GaAs layer 3 is exposed. This results in forming the semiconductor layers of cliff shape in a region including the recess of the semi-insulating GaAs substrate 2. After formation of the semiconductor layers, a silicon nitride film (Si$_3$N$_4$) is deposited on the p-type GaAs layer 5 by a thin film deposition method such as plasma CVD to form an antireflection film 8.

Similarly, a silicon nitride film is laid on the semi-insulating GaAs substrate 2 to form an insulating film 9 as a surface protecting film, and a silicon nitride film is laid on the lower-step-side ramp portion of the semiconductor layers to form an insulating film 9 as a side wall protecting film. The antireflection film 8 and insulating films 9 do not have to be formed separately from each other, but a silicon nitride film deposited by a single plasma CVD step can function as an antireflection film or as an insulating film, depending upon its forming location. A thin film of n-side ohmic electrode 7 is deposited and patterned so as to contact the exposed part of the n-type GaAs layer 3, and a thin film of p-side ohmic electrode 6 is deposited and patterned so as to contact the exposed part of the p-type GaAs layer 5, each by vacuum vapor deposition. As a result, the semiconductor photodetector 1 comes to have the planar shape and sectional shape shown in FIGS. 1A and 1B.

As described above, the semiconductor photodetector 1 in the present first embodiment is constructed as a pin-type PD of the selectively buried type structure in which the semiconductor layers are epitaxially grown by selective growth such as MOCVD only in the recess of the semi-insulating GaAs substrate 2 formed by etching. Accordingly, the low-capacitance semiconductor photodetector with the both p-side and n-side wiring electrodes provided on the semi-insulating GaAs substrate 2 can be fabricated without using the special technique of etching back the semiconductors and the substance such as the photoresist with completely different characteristics simultaneously at an equal rate, in the step of exposing the n-type GaAs layer 3. Since the wiring electrodes are placed on a flat surface without level difference on the semi-insulating substrate, the semiconductor photodetector can be produced while reducing the risk of disconnection and insulation failure due to deterioration of coverage. As a result, it becomes feasible to realize the semiconductor photodetector improved in yield and reproducibility, without difficulty and at low cost.

The present embodiment described the example of GaAs for the semi-insulating substrate and for the semiconductors used in the composition of the semiconductor layers, but any material other than it can also be adopted, e.g., III-V semiconductors such as InP, InGaAs, InAs, etc. and compound semiconductors such as ZnS, SiC, and so on. Furthermore, the materials can also be selected from single-element semiconductors such as Si, Ge, and so on. The semi-insulating substrate and semiconductor layers may be those of semiconductors of different kinds under heterojunction. The impurity (donor) to be added in the n-type semiconductor can be selected from Se, Si, P, and so on, and the impurity (acceptor) to be added in the p-type semiconductor can be selected from Zn, Mg, B, and so on.

Other embodiments being modifications of the present invention will be described below with reference to FIG. 3A to FIG. 10E. Concerning the semiconductor photodetectors in the other embodiments, the basic configuration thereof is similar to the configuration of the semiconductor photodetector detailed in the first embodiment, and therefore each component will be denoted by the same reference symbol, without description thereof. Only differences (the shape of the recess, the deposition method, etc.) from the first embodiment will be described below.

Second Embodiment

The second embodiment of the present invention will be described with reference to FIGS. 3A, 3B, 3C, 3D, and 3E. FIGS. 3A, 3B, and 3C are schematic sectional views of semiconductor photodetector 1 in the second embodiment of the present invention, and the steps of FIG. 3A, FIG. 3B, and FIG. 3C are carried out in the aforementioned order of steps ①, ②, and ③. FIG. 3A shows a cross section along AA' in FIG. 3D, and FIG. 3C a view showing a cross section along AA' in FIG. 3E.

In the second embodiment detailed description will be given about the shape of the etching cross section in the recess forming step, which was not described in the first embodiment. Specifically, the second embodiment illustrates a case where the shape of the etching cross section is an inverted mesa shape. Here the inverted mesa shape is a state in which distances between two sides forming side walls in the etching sectional shape increase toward the bottom side (so-called ⋏-shape).

A production method of the semiconductor photodetector 1 in the second embodiment will be described below. First, photolithography is carried out to form a pattern preliminarily set so as to obtain the etching section along inverted mesa directions, and thereafter the semi-insulating GaAs substrate 2 is subjected to chemical etching. This results in forming the recess having the sectional shape shown in FIG. 3A, in the semiconductor photodetector 1. Thereafter, as in the first embodiment, the n-type, i-type, and p-type semiconductor layers 3, 4, and 5 are successively deposited in the recess by a crystal growth method such as low pressure MOCVD, as shown in FIG. 3B.

Since the recess is of the inverted mesa shape, it can prevent climbing of each GaAs layer near the ramp portion and a projection of the p-type GaAs layer 5 in the surface part can be small. Then, as shown in FIG. 3C, a part of the semi-insulating GaAs substrate 2 is selectively etched until a part of the top surface of the n-type GaAs layer 3 is exposed. Thereafter, the antireflection film 8 and insulating film 9 are deposited and the ohmic electrodes 6, 7 are placed.

In the semiconductor photodetector 1 of the second embodiment, as described above, the recess is formed in the semi-insulating GaAs substrate 2 so as to have the etching section along the inverted mesa directions. Accordingly, it is feasible to minimize the projection in the surface part due to the climbing phenomenon of the semiconductor layers. As a result, the p-side ohmic electrode 6 is placed on a flat surface with a minimum level difference, whereby there is little possibility of disconnection.

Third Embodiment

The third embodiment of the present invention will be described below with reference to FIGS. 4A, 4B, 4C, 4D, and 4E. FIGS. 4A, 4B, and 4C are schematic sectional views of semiconductor photodetector 1 in the third embodiment of the present invention, and the steps of FIGS. 4A, 4B, and 4C are successively carried out in the same manner as in FIGS. 3A, 3B, and 3C. FIG. 4A corresponds to a cross section along AA' in FIG. 4D, and FIG. 4C to a cross section along AA' in FIG. 4E.

The third embodiment is different from the second embodiment in that the ohmic electrodes 6, 7 are arranged at an angle of approximately 90° around the recess being the lower step portion (with the recess in between) and in that sectional shapes are different between the two electrode sides.

As shown in FIG. 4C, the recess of the semi-insulating GaAs substrate 2 is formed so that only the p-side ohmic electrode 6 is of the inverted mesa shape, out of the two side wall portions forming the sectional shape in the direction connecting the p-side ohmic electrode 6 to the n-side ohmic electrode 7. In this sectional shape, as shown in the plan view of FIG. 4E, the p-side ohmic electrode 6 and the n-side ohmic electrode 7 are arranged to make a right angle. On the occasion of forming a cliff, the angle of inclination of the side wall can be made gentler, for example, by a chemical etching treatment of immersing the semi-insulating GaAs substrate 2 in a mixed liquid of a phosphate ($H_3PO_4$), hydrogen peroxide, and water prepared at a predetermined mixture ratio (1:1:10 at ordinary temperature).

Fourth Embodiment

FIGS. 5A, 5B, and 5C are schematic sectional views of semiconductor photodetector 1 in the fourth embodiment of the present invention, and the steps of FIGS. 5A, 5B, and 5C are successively carried out in the same manner as in FIGS. 3A, 3B, and 3C. FIG. 5A corresponds to a cross section along AA' in FIG. 5D, and FIG. 5C to a cross section along AA' in FIG. 5E.

As shown in FIG. 5A, the recess of the semi-insulating GaAs substrate 2 is formed so that the sectional shape in the direction connecting the p-side ohmic electrode 6 to the n-side ohmic electrode 7 is of the normal mesa shape with a relatively steep slope. This sectional shape can be implemented, for example, by chemical etching to immerse the semi-insulating GaAs substrate 2 in a mixed solution of aqueous ammonia ($NH_4OH$), hydrogen peroxide, and water prepared at a predetermined mixture ratio (1:1:10 at ordinary temperature). In this case, the projection of p-type GaAs layer 5 in the surface part can be made relatively small, depending upon the fabrication method, whereby the possibility of disconnection can be decreased.

Fifth Embodiment

The fifth embodiment will be described below with reference to FIGS. 6A, 6B, 6C, 6D, and 6E. FIGS. 6A, 6B, and 6C are schematic sectional views of semiconductor photodetector 1 in the fifth embodiment of the present invention, and the steps of FIGS. 6A, 6B, and 6C are successively carried out in the same manner as in FIGS. 3A, 3B, and 3C. FIG. 6A corresponds to a cross section along AA' in FIG. 6D, and FIG. 6C to a cross section along AA' in FIG. 6E. As shown in FIG. 6A, the recess of the semi-insulating GaAs substrate 2 is formed in the normal mesa shape with the sectional shape of a gentle slope in the direction connecting the p-side ohmic electrode 6 to the n-side ohmic electrode 7. In this case, the p-type GaAs layer 5 forms a large projection in the surface part, so as to raise the possibility of disconnection due to deterioration of coverage of the p-side ohmic electrode 6, and it is thus necessary to form the p-side ohmic electrode 6 in a larger thickness.

Sixth Embodiment

FIGS. 7A, 7B, and 7C are schematic sectional views of semiconductor photodetector 1 in the sixth embodiment of the present invention, and the steps of FIGS. 7A, 7B, and 7C are successively carried out in the same manner as in FIGS. 3A, 3B, and 3C. FIG. 7A corresponds to a cross section along AA' in FIG. 7D, and FIG. 7C to a cross section along AA' in FIG. 7E. As shown in FIG. 7, the recess of the semi-insulating GaAs substrate 2 is formed in a shape in which the sectional shape in the direction connecting the p-side ohmic electrode 6 to the n-side ohmic electrode 7 is very close to a rectangle (i.e., in a state in which two sides forming side walls are nearly parallel to each other). This sectional shape can be realized by dry etching with chlorine gas or the like, instead of wet etching including chemical etching. By such an etching method, it is feasible to place the electrodes in any direction without preliminary consideration to the mesa direction of the recess, while reducing the projection in the surface part as much as possible.

Seventh Embodiment

The seventh embodiment of the present invention will be described below with reference to FIGS. 8A, 8B, 8C, 8D, and 8E. The description hereinafter will be given without description about the mesa shape, the projection, and others, for simplification of description.

Figure 8A:
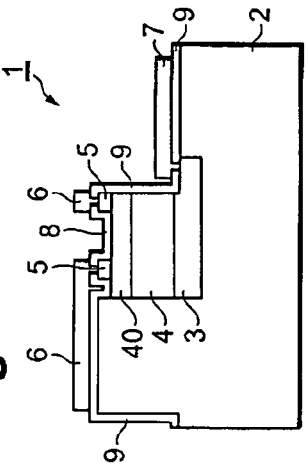
FIG. 8A is a view showing a recess forming step of a semiconductor photodetector as a seventh embodiment, FIG. 8B a view showing a deposition step, FIG. 8C a view showing an exposing step, FIG. 8D a plan view corresponding to FIG. 8A, and FIG. 8E a plan view corresponding to FIG. 8C.
Figure 8B:
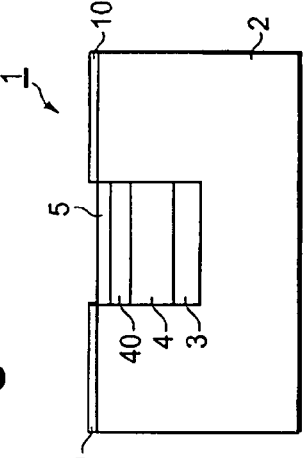
Figure 8C:
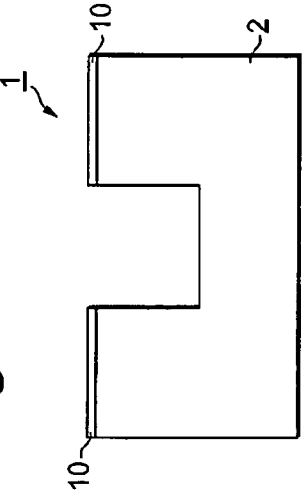
Figure 8D:
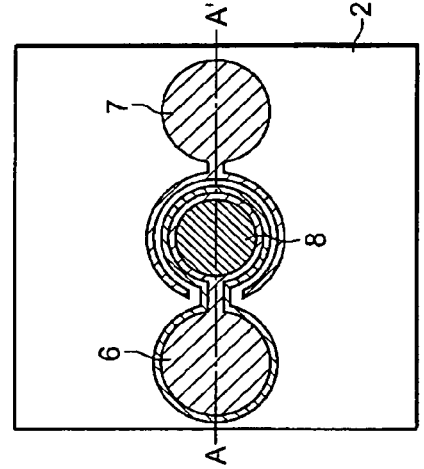
Figure 8E:
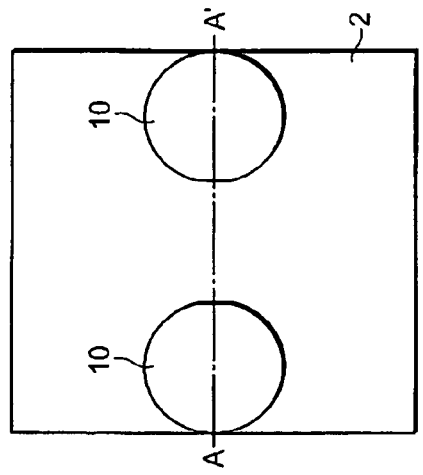

FIGS. 8A, 8B, and 8C are schematic sectional views of semiconductor photodetector 1 in the seventh embodiment of the present invention, and the steps of FIGS. 8A, 8B, and 8C are successively carried out in the same manner as in FIGS. 3A, 3B, and 3C. FIG. 8A corresponds to a cross section along AA' in FIG. 8D, and FIG. 8C to AA' in FIG. 8E. The present embodiment is different from the first embodiment in that a window layer 40 as shown in FIGS. 8B and 8C is deposited between the i-type GaAs layer 4 and the p-type GaAs layer 5.

Namely, after the n-type GaAs layer 3 and the i-type GaAs layer 4 (light absorbing layer) are grown in the recess of the semi-insulating GaAs substrate 2, an AlGaAs layer 40 (window layer) is grown thereon. Then the p-type GaAs layer 5 is grown thereon. The thicknesses of the respective GaAs layers are preferably set as follows: for example, where the depth of the recess is about 3.5 μm, the n-type GaAs layer 3 is about 1 μm thick, the i-type GaAs layer 4 about 2 μm thick, the AlGaAs layer 40 about 0.5 μm thick, and the p-type GaAs layer 5 about 0.05 μm thick.

Then the p-type GaAs layer 5 corresponding to a light receiving portion is selectively removed by etching to expose the AlGaAs layer 40. Thereafter, as in the first embodiment, the semi-insulating GaAs substrate 2 is etched so as to expose a part of the n-type GaAs layer 3; the antireflection film 8 and insulating film 9 are deposited; and then the p-side ohmic electrode 6 and n-side ohmic electrode 7 are placed. As a result, the semiconductor photodetector 1 comes to have the structure shown in FIG. 8C. In this structure, incident light passes through the AlGaAs layer 40 transparent to near-infrared light, without passing through the p-type GaAs layer 5, to reach the i-type GaAs layer 4. Therefore, the p-type GaAs layer 5 can be formed in a larger thickness and the photosensitivity can be improved.

Eighth Embodiment

FIGS. 9A, 9B, and 9C are schematic sectional views of semiconductor photodetector 1 in the eighth embodiment of the present invention, and the steps of FIGS. 9A, 9B, and 9C are successively carried out in the same manner as in FIGS. 3A, 3B, and 3C. FIG. 9A corresponds to a cross section along AA' in FIG. 9D, and FIG. 9C to a cross section along AA' in FIG. 9E. The present embodiment is different from the first embodiment in that the semi-insulating substrate is, particularly, semi-insulating InP 21 and in that the semiconductor layers grown are, particularly, n$^+$-InP 31 1 μm thick, i-InGaAs 41 2 μm thick, and p$^+$-InP 51 0.05 μm thick. By employing this composition, incident light of infrared light having the wavelength of not less than 1 μm is photoelectrically converted by i-InGaAs 41 to generate a photocurrent. This enables detection of infrared light having the wavelength of not more than 1.7 μm.

Ninth Embodiment

Finally, the ninth embodiment of the present invention will be described with reference to FIGS. 10A, 10B, 10C, 10D, and 10E. FIGS. 10A, 10B, and 10C are schematic sectional views of semiconductor photodetector 1 in the ninth embodiment of the present invention, and the steps of FIGS. 10A, 10B, and 10C are successively carried out in the same manner as in FIGS. 3A, 3B, and 3C. FIG. 10A corresponds to a cross section along AA' in FIG. 10D, and FIG. 10C to a cross section along AA' in FIG. 10E.

The present embodiment is substantially identical with the eighth embodiment but is different therefrom in that, after growth of p$^+$-InP 52 in the thickness of 1 μm in the recess, n$^+$-InP 11 including an n-InP guard ring 12 is formed by two selective diffusion or ion implantation operations. This makes it feasible to apply the present invention not only to the pin type photodiodes but also to the APDs (Avalanche Photo Diodes). Namely, after growth of p$^+$-InP as 32, p-InGaAs as 42, and p-InP as 52, n$^+$-InP 11 including the n-InP guard ring 12 is formed by two selective diffusion or ion implantation operations. This enables even formation of APD.

It is noted that the photodetector and its production method according to the present invention are not limited to the forms described in the above embodiments, but a variety of modifications can be contemplated according to other conditions and the like. For example, each of the above embodiments except for the third embodiment described the example in which the p-side ohmic electrode 6 and the n-side ohmic electrode 7 were located at the opposite positions with the recess in between, but it is also possible to adopt a configuration in which the electrodes are arranged so that an acute angle made by the electrodes and the center of the bottom surface of the recess on the top plan view is a predetermined angle (e.g., 90°).

The top shape of the recess and each electrode is not limited to the circular shape, either, but may be any shape, e.g., rectangular. Furthermore, in each of the above embodiments the p-type semiconductor layer was formed above the n-type semiconductor layer, but, conversely, the n-type semiconductor layer may be formed above the p-type semiconductor layer. In addition, the detailed structure of the semiconductor photodetector can also be properly modified within the scope not departing from the spirit of the present invention.

In the semiconductor photodetector according to the present invention, as described above, the p-side and n-side electrodes both can be placed on the flat surface, so as to prevent the disconnection and insulation failure. As a result, the semiconductor photodetector can be realized with high yield and reproducibility.

In addition, the semiconductor photodetector with high reliability can be readily produced by the production method of the semiconductor photodetector according to the present invention, without requiring any special etching technique.

INDUSTRIAL APPLICABILITY

The present invention can be applied to photodetectors.

The invention claimed is:

1. A semiconductor photodetector comprising:
  a semi-insulating substrate having an upper step surface, a middle step surface, and a lower step surface with their respective heights different from each other in a top surface portion, the lower step surface being located between the upper step surface and the middle step surface in a lateral direction, wherein a side wall forming a boundary between the lower step surface and the upper surface being inclined so as to form an acute angle between the side wall and the lower step surface;
  a first semiconductor layer formed immediately above the lower step surface, having a first top surface portion of a flat surface shape with a height equal to that of the middle step surface and a second top surface portion with a height equal to or higher than that of the first top surface portion, and comprising a first impurity;
  a second semiconductor layer formed above the second top surface portion of the first semiconductor layer, having a top surface portion of a flat surface shape with a height equal to that of the upper step surface, and comprising a second impurity;
  a first electrode provided astride and above the first top surface portion of the first semiconductor layer and the middle step surface of the semi-insulating substrate; and
  a second electrode provided astride and above the top surface portion of the second semiconductor layer and the upper step surface of the semi-insulating substrate.

2. The semiconductor photodetector according to claim 1, further comprising a third semiconductor layer formed between the first semiconductor layer and the second semiconductor layer and having a carrier density lower than that of the first semiconductor layer or the second semiconductor layer.

3. A method of production of a semiconductor photodetector comprising:
  a first step of forming a recess with a predetermined depth in a semi-insulating substrate by etching, wherein a distance between two side walls of the recess increases toward a bottom of the recess so as to form an inverted mesa shape;
  a second step of forming a stack of a first semiconductor layer comprising a first impurity and a second semiconductor layer comprising a second impurity, selectively only in the recess of the semi-insulating substrate formed in the first step;
  a third step of further etching a part of the semi-insulating substrate so as to expose at least a portion of the first semiconductor layer formed in the second step; and
  a fourth step of laying a first electrode in contact with the exposed portion of the first semiconductor layer exposed in the third step and laying a second electrode in contact with the second semiconductor layer above the semi-insulating substrate.

4. The method according to claim 3, wherein the second step is to form the stack of the first semiconductor layer and the second semiconductor layer by vapor deposition.

* * * * *